United States Patent [19]

Uehara et al.

[11] Patent Number: 4,558,949
[45] Date of Patent: Dec. 17, 1985

[54] HORIZONTAL POSITION DETECTING DEVICE

[75] Inventors: Makoto Uehara, Tokyo; Takeshi Sudo, Funabashi; Fujio Kanatani, Yokosuka, all of Japan

[73] Assignee: Nippon Kogaku KK, Tokyo, Japan

[21] Appl. No.: 419,514

[22] Filed: Sep. 17, 1982

[30] Foreign Application Priority Data

Dec. 26, 1981 [JP] Japan ............................... 56-211130

[51] Int. Cl.⁴ ........................ G01B 11/26; G01C 1/00
[52] U.S. Cl. .................................. 356/152; 250/561; 356/1; 356/375; 356/400
[58] Field of Search .................. 356/375, 400, 152, 1; 250/561

[56] References Cited

U.S. PATENT DOCUMENTS

| | | | |
|---|---|---|---|
| 3,541,338 | 11/1970 | Duda et al. | 356/152 |
| 3,645,623 | 2/1972 | Patten | 356/1 |
| 3,880,524 | 4/1975 | Dill et al. | 356/152 |
| 4,356,392 | 10/1982 | Wittekoek et al. | 250/561 |
| 4,477,185 | 10/1984 | Berger | 356/1 |

FOREIGN PATENT DOCUMENTS 0197402 12/1982 Japan ............................... 356/375

OTHER PUBLICATIONS

K. E. Rhodes, IBM Tech. Discl. Bul., vol. 21, #10, Mar. 1979, p. 4121.

*Primary Examiner*—S. C. Buczinski
*Attorney, Agent, or Firm*—Fitzpatrick, Cella, Harper & Scinto

[57] ABSTRACT

Disclosed is a horizontal position detecting device for maintaining the surface of a body to be inspected vertically to the optical axis of a main objective lens. The device includes an illumination optical system and a condenser lens system. The illumination optical system supplies parallel light rays to the surface of the body from the direction oblique to the optical axis of the objective lens. The condenser lens system condenses the light rays supplied by the illumination optical system and reflected by the surface of the body. The optical axes of the illumination optical system and the condenser lens system are arranged substantially symmetrically with respect to the axis of the objective lens.

14 Claims, 3 Drawing Figures

HORIZONTAL POSITION DETECTING DEVICE

BACKGROUND OF THE INVENTION

1. Field of the Invention

This invention relates to a reference position detecting device and more particularly to a horizontal position detecting device for correctly positioning a wafer surface or a surface of a body to be inspected at a position vertical to the optical axis of an objective lens.

2. Description of the Prior Art

In general, for an exposure device of reduction projection type used for making an integrated circuit, a projecting objective lens having a large numerical aperture (N.A.) has been used so that an allowable focus range was very small. Therefore unless the exposing region of a wafer is maintained at an exact vertical position relative to the optical axis of a projecting objective lens, it was not possible to make a clear pattern exposure over the whole exposing region. The whole of a wafer could be aligned in nearly vertical position by detecting three points on the surface of the wafer using a separately arranged auto-focus mechanism. However, as a wafer becomes larger or a wafer is made of a new material such as gallium-arsenic instead of silicon, evenness of the surface of the wafer per se becomes unstable, so that it is necessary to detect vertical positions of the respective parts of the wafer. Therefore, each time the exposure and chemical treatment have been made, the deformation of the wafer is increased and it becomes indispensable to detect correct horizontal positioning of the exposure regions.

SUMMARY OF THE INVENTION

It is a primary objects of the present invention to provide a detecting device to detect, without touching the wafer etc. that the inspecting region or exposing region by an objective lens locates at its correct vertical position relative to the optical axis of the objective lens.

The arrangement of the horizontal position detecting device of the present invention includes an illumination optical system to direct parallel light flux emitted through a very small aperture to a region conjugate with a main objective lens from the direction oblique to the optical axis of the main objective lens, and a condenser lens system to condense on a light receiving element the light flux supplied by the illumination optical system and reflected at that conjugate region, the optical axes of both optical systems being arranged symmetrically with respect to the optical axis of the main objective lens, thereby judging by the output of the light receiving element whether or not the conjugate region locates vertically to the main objective lens.

The invention will become more fully apparent from the following detailed description of illustrative embodiments shown in the accompanying drawings.

DESCRIPTION OF THE PREFERRED EMBODIMENTS

Figure 1:
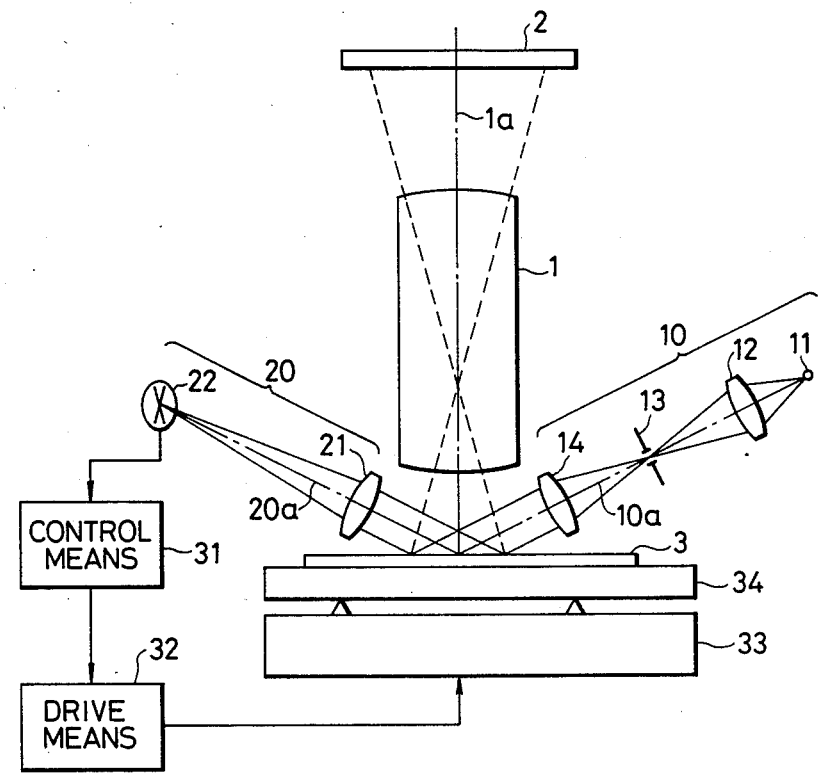
FIG. 1 shows optical paths of a first embodiment of this invention.

Some embodiments of the invention will be described in detail with reference to the drawing.

FIG. 1 shows a first embodiment of this invention which is applied to an exposure device of the reduction projection type. Reticle 2 and wafer 3 are maintained at positions conjugate with each other with respect to a projecting objective lens 1, and a pattern on the reticle 2 illuminated by a not shown illumination optical system is reduction-projected on the wafer 3. Such printing exposure, which is called a step-and-repeat process, is repeated as the wafer is shifted by a predetermined amount and further, such steps are repeated every time the reticles having different patterns are exchanged. The illumination optical system 10 comprises a light source 11, a condensing lens 12, a stop 13 having a pin hole, an illuminating objective lens 14, and the condensing lens 12 forming an image of the light source 11 on the stop 13, and parallel light flux is supplied by the illuminating objective lens 14 having the focal point on the stop 13. The light supplied by the illuminating objective system 10 has a wave length different from that of the exposing light so as to avoid photosensitizing the resist on the wafer 3. The condenser optical system 20 comprises light receiving objective lens 21 and light receiving element 22 divided into four parts, and the light supplied by the illumination optical system 10 and reflected at the wafer 3 is received by the light receiving objective lens 21 and condensed on the four-divided light receiving element 22 provided at the focal point position of the objective lens 21. It is noted that the optical axis $10a$ of the illumination optical system 10 and the optical axis $20a$ of the light receiving optical system 20 are symmetrically positioned with respect to the optical axis $1a$ of the projecting objective lens 1. Consequently, if the exposing region of the wafer 3 maintains the vertical position relative to the optical axis $1a$ of the objective lens 1, the light flux from the illumination optical system 10 is condensed on the central position of the four-divided light receiving element 22. And if the exposing region of the wafer 3 makes an angle $\theta$ to the vertical relative to the optical axis of the objective lens 1, the parallel light from the illumination optical system reflected by the wafer 3 inclines $2\theta$ to the optical axis $20a$ of the light receiving optical system 20 so that it is condensed at a position outside of the central position of the light receiving element 22. Therefore, from the position of the condensing point on the light receiving element 22, the direction of inclination of the exposing region of the wafer 3 is detected, and control means 31 produces a control signal corresponding to the direction and amount of the deviation of the condensing point on the four-divided light receiving element, and drive means 32 moves supporting device 33 so as to correct the inclination of the surface of the exposing region of the wafer 3 by the movement of stage 34 on which the wafer is placed.

According to the above explained structure, only a part of the wafer surface corresponding to the region illumination by the illumination optical system 10 is detected with its local inclination, so that by making the illuminating region of the wafer 3 substantially equal to the exposing region by the projecting objective lens 1, it becomes possible to automatically set an average correct vertical position of the exposing region relative to the optical axis $1a$ of the objective lens 1.

Figure 2:
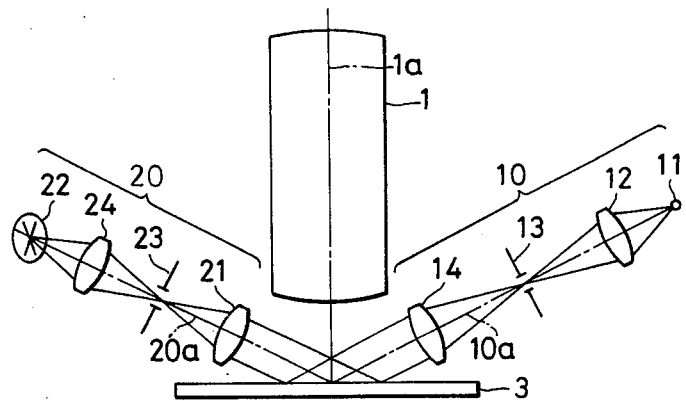
FIG. 2 shows optical paths of a second embodiment.

A second illustrative embodiment of this invention as shown in FIG. 2 adds to the structure of FIG. 1 a stop 23 having a circular aperture and condensing lens 24 in the light receiving optical system 20. Therefore, in FIG. 2, the control means, drive means and supporting device were omitted as these means are substantially the same as in FIG. 1.

The parallel light ray supplied by the illumination optical system 10 and reflected at the wafer 3 is condensed by the condensing objective lens 21 on the stop 23 disposed at its focal point, and it will be focused or condensed on the four-divided light receiving element 22 conjugate with the stop 23 relative to the condenser lens 24 at a deviated position corresponding to the inclination of the illuminating region of the wafer 3.

In general, a predetermined circuit pattern formed on the wafer 3 comprises fine rectangular patterns formed with a certain degree of regularity, so that diffraction light is produced in addition to the direct reflecting light of the illuminating light. In the second embodiment, however, since the stop 23 will eliminate the diffraction light as that less noise is produced at the light receiving element 22 and much precise detection can be expected.

Figure 3:
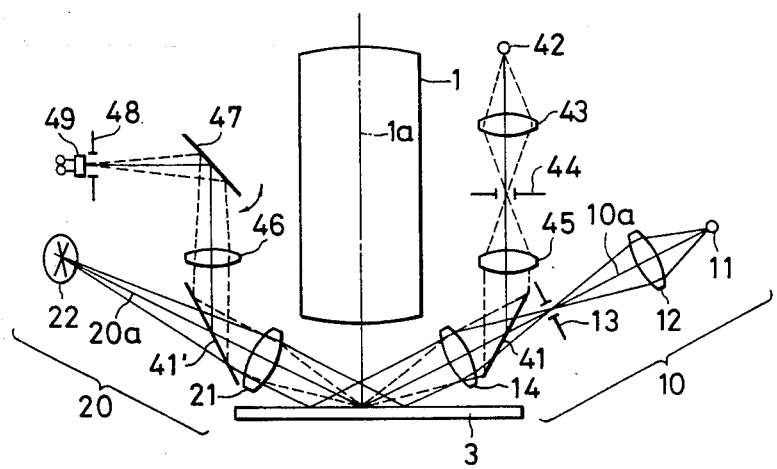
FIG. 3 shows optical paths of a third embodiment.

A third embodiment of this invention shown in FIG. 3 combines focal point detection device with the structure of FIG. 1. In FIG. 3, the control means 31, drive means 32 and stage 34 were omitted and the same reference numerals were assigned to the members having substantially the same functions. The illumination optical system 10 and the light receiving optical system 20 are the same as in the first embodiment, but a first dichroic mirror 41 is obliquely disposed between the objective lens 14 and the stop 13 within the illumination optical system 10 and a second dichroic mirror 41' is obliquely disposed between the objective lens 21 and the four-divided light receiving element 22 of the light receiving optical system 20. A second light source 42 produces a third light having a wave length not only different from that of the light source 11 in the illumination optical system 10, but also different from the light exposing the wafer 3 by the objective lens 1.

The light coming from the second light source 42 is condensed by condenser lens 43 on the stop 44 having a linear aperture and this light is made as parallel light by collimator lens 45 to arrive at the first dichroic mirror 41. The parallel light reflected by the first dichroic mirror 41 is focussed by the objective lens 14 on its focal point and is then reflected by the wafer 3 to enter into the condensing objective lens 21. The light passing the condensing objective lens 21 and reflected by the second dichroic mirror 41' is condensed on a second light receiving element 49 neighbouring at the rear of the stop 48 having a linear aperture with the aid of the condensing lens 46 and oscillating mirror 47. When the location of the wafer 3 coincides with the focal point of both objective lenses 14 and 21, the light emitted from the objective lens 21 becomes parallel so that the image of the linear opening of the stop 44 is formed on the stop 48 having the linear opening. The oscillating mirror 47 oscillates the light in the direction perpendicular to the linear openings of the stops 44 and 48. The image of the stop 44 is projected on the surface of the wafer by the collimator lens 45 and the objective lens 14. As long as the wafer surface is located at a position conjugate with the stop 48 relative to the objective lens 21 and the condenser lens 46, powers of respective lenses are optionally selected. It is also possible to omit the collimator lens 45 and the condenser lens 46. Such focal point detecting mechanism is described in detail in Japanese patent application No. 117844/1979 filed Sept. 17, 1979 in Japan and laid opened as Japanese laid-open application No. 42205/1981, and the automatic focussing is also possible. In FIG. 3, the light for detecting the horizontal position is shown in solid line while the light for detecting the focal point is shown by dotted line.

Further, the light for detecting the horizontal position should be different from the light for the automatic focussing, and it is preferable that the four-divided light receiving element 22 and the light receiving element 49 should have different sensitivity characteristics, and by these arrangements, the respective signals can be treated independently when they function simultaneously. However, if both lights do not function simultaneously they may have the same wave length, and in this case, a beam splitter such as semi-transmitting mirror should be used as for the first and second dichroic mirrors 41 and 41', respectively. In any way, projecting objective lens 14 and condensing objective lens 21 have two functions, respectively. For detecting the focal point with respect to the wafer 3, the light flux between the two objective lenses 14, 21 should be focussing type light while for detecting the horizontal position, this light should be parallel type light.

According to the structure of the third embodiment, two objective lenses 14 and 21 for detecting the horizontal position are commonly used for detecting the focal point, so that two detecting optical systems can be simply arranged and the complexity around the objective lens 1 can be avoided. Especially, in a reduction projection type exposing device for making an integrated circuit, a plurality of automatic transfer means for wafers and microscopy for aligning the wafers are disposed around the projection objective lens, there is a shortage of space to provide light paths for new optical systems. The arrangement of the third embodiment can be conveniently installed within the conventional optical system for an automatic focussing mechanism.

As explained in the foregoing, according to this invention, it is easy to detect, without contacting the wafer etc., the setting at the correct vertical position of a partial region having a predetermined conjugate relation with an objective lens relative to the optical axis of the objective lens, such region being, for example, the exposing region of a wafer exposed by the reduction projection objective lens. Further, even if there are small concave or convex portions in the partial region of the wafer to be illuminated by the parallel light, the average plane surface of this partial region is disposed vertically relative to the optical axis of the objective lens, it is possible to obtain the best image over the partial region even if the allowable focus region, that is depth of field, is extremely narrow.

It is nothing to say that although explanation was made relating to the reduction projection type exposing device shown in the embodiments, it is applicable to general microscopes.

We claim:

1. A leveling device for maintaining the surface of an object to be inspected vertically relative to the optical axis of an image forming means comprising:
   support means for supporting the object so as to be able to control the inclination of the object surface with respect to said optical axis of said image forming means;

an illuminating optical system having an optical axis obliquely arranged to the optical axis of said image forming means for supplying parallel light rays to the object surface from a direction oblique to the optical axis of said image forming means;

a condenser optical system having an optical axis arranged symmetrically with said optical axis of said illumination optical system with respect to said optical system of said image forming means for condensing the parallel light rays supplied from said illuminating optical system and reflected on said object surface, said condenser optical system including converging unit for converging the parallel light rays reflected on said object surface and a light receiving member disposed at the position where said parallel light rays are converged by said converging unit and generating signals corresponding to the position of said converged light rays; and control means for controlling said support means based on the signals generated by said light receiving member so as to maintain the position of said converged light rays at a predetermined position on said light receiving member.

2. A leveling device according to claim 1, in which the illumination optical system comprises a light source, a condensing lens to form the image of the light source, a stop having a pin hole disposed at a position where the light source image is formed, and an illuminating objective lens, of which the focal point coniciding with the position of said pin hole of the stop.

3. A leveling device according to claim 2 further comprising a first beam splitter located between the illuminating objective lens and the stop in the illumination optical system; a second beam splitter located between the condensing objective lens and the light receiving element in the condenser optical system; a projection optical system for projecting an aperture image on the surface of the object to be inspected through the first beam splitter and the illuminating objective lens; and an image forming, optical system for focussing the aperture image projected on the surface of the body on another light receiving element.

4. A leveling device according to claim 3, in which said first and second beam splitters are dichroic mirrors, respectively, and said projection optical system has a light source producing a light having a wave length different from a wave length of the light emitted from the light source in the illumination optical system.

5. A leveling device according to claim 1, wherein said converging unit includes a condenser objective lens for condensing the parallel light rays reflected on said object surface at a rear focal plane of the condenser objective lens, a filtering stop for eliminating diffraction lights caused on the object surface, disposed at the rear focal point of said condenser objective lens, and a condenser lens for forming a conjugate position with said rear focal point of the condenser objective lens with respect to the condenser lens, and wherein said light receiving member is disposed at the conjugate position with said rear focal point of the condenser objective lens.

6. A leveling device according to claim 5, wherein said illuminating optical system illuminates a region of the object surface which region is substantially equal to the region inspected through said image forming means.

7. A leveling device for projection type exposure apparatus including
projection objective means,
a reticle having a projection pattern thereon and
a wafer disposed to receive on a predetermined region thereof a projected image of said projection pattern of said reticle through said projection objective means, said leveling device comprising:

support means for supporting the wafer so as to be able to control the inclination of the wafer with respect to the optical axis of said projection objective means;

an illuminating optical system having an optical axis obliquely arranged to the optical axis of said projection objective means for supplying parallel light rays to the wafer from a direction oblique to the optical axis of said projection objective means;

a condenser optical system having an optical axis arranged symmetrically with said optical axis of said illumination optical system with respect to said optical axis of said projection objective means for condensing the parallel light rays supplied from said illuminating optical system and reflected on said wafer, said condenser optical system including converging unit for converging the parallel light rays reflected on said wafer and a light receiving member disposed at the position where said parallel light rays are converged by said converging unit for generating signals corresponding to the position of said converged light rays; and control means for controlling said support means based on the signals generated by said light receiving member so as to maintain the position of said converged light rays at a predetermined position on said light receiving member.

8. A leveling device according to claim 7, wherein said illuminating optical system illuminates the region on the wafer which region is substantially equal to said predetermined region of the wafer on which the image of said projection pattern of said retical is to be projected.

9. A leveling device according to claim 8, wherein said converging unit includes a condenser objective lens for condensing the parallel light rays reflected on said wafer at a rear focal plane of the condenser objective lens, a filtering stop member, for eliminating diffraction lights caused on the wafer, disposed at the rear focal point of said condenser objective lens, and a condenser lens for forming a conjugate position with said rear focal point of the condenser objective lens with respect to the condenser lens, and wherein said light receiving member is disposed at the conjugate position with said rear focal point of the condenser objective lens.

10. A leveling device according to claim 9, wherein said illuminating optical system comprising, a light source, a condensing lens to form the image of the light source, a stop having a pin hole disposed at a position where the light source image is formed, and an illuminating objective lens, of which the focal point coinciding with the position of said pin hole of the stop.

11. A leveling device according to claim 10, further comprises a first beam splitter located between the illuminating objective lens and the stop having a pin hole in the illumination optical system; a second beam splitter located between the condenser objective lens and the light receiving element in the condenser optical system; a projection optical system for projecting a linear aperture image on the wafer through the first beam splitter and the illuminating objective lens; and an image forming optical system for focusing the linea aperture image projected on the wafer onto another light receiving element through said condenser objective lens and said second beam splitter.

12. A leveling device according to claim 11, wherein said image forming optical system includes an oscillating mirror for oscillating the linear aperture image on the light receiving surface of said another light receiving element, and wherein said another light receiving element generates signals corresponding to the focusing condition of the wafer relative to said projection objective means.

13. A leveling device according to claim 11, wherein said first and second beam splitters are dichroic mirrors, respectively, and said projection optical system has a light source emitting a light having a wave length different from a wave length of the light emitted from the light source in the illuminating optical system.

14. A leveling device according to claim 13, wherein a wave length of the exposure light of said exposure apparatus is different from both wave length of the illuminating optical system and wave length of said projection optical system.

* * * * *

UNITED STATES PATENT AND TRADEMARK OFFICE
CERTIFICATE OF CORRECTION

PATENT NO. : 4,558,949
DATED : December 17, 1985
INVENTOR(S) : MAKOTO UEHARA, ET AL.

It is certified that error appears in the above-identified patent and that said Letters Patent are hereby corrected as shown below:

Column 1, line 38, change "objects" to --object--.

Column 2, line 62, change "illumination" to --illuminated--.

Column 3, line 22, change "as" to --so--;

line 26, after "combines" insert --a--.

Column 5, line 9 (Claim 1, line 16), change "system" to --axis--;

line 32 (Claim 3, line 2), change "comprising" to --comprises--.

Column 6, line 68 (Claim 11, line 10), change "linea" to --linear--.

Signed and Sealed this

Fourth Day of March 1986

[SEAL]

Attest:

DONALD J. QUIGG

Attesting Officer

Commissioner of Patents and Trademarks